United States Patent [19]

Allen

[11] 4,234,845

[45] Nov. 18, 1980

[54] AUTOMATIC CONTROL OF ARMING SIGNAL FOR TIME INTERVAL MEASUREMENTS

[75] Inventor: Mark S. Allen, Saratoga, Calif.

[73] Assignee: Hewlett-Packard Company, Palo Alto, Calif.

[21] Appl. No.: 959,969

[22] Filed: Nov. 13, 1978

[51] Int. Cl.³ .......................................... G01R 25/00
[52] U.S. Cl. .................................. 324/83 D; 368/121
[58] Field of Search ............. 324/181, 186, 187, 78 Z, 324/83 R, 83 D, 140 R, 140 D

[56] References Cited

U.S. PATENT DOCUMENTS

| | | | |
|---|---|---|---|
| 3,286,176 | 11/1966 | Birnboim | 324/83 D |
| 3,579,104 | 5/1971 | Pignard | 324/83 D |
| 3,760,270 | 9/1973 | Irvin | 324/83 D |
| 4,000,466 | 12/1976 | Scouten et al. | 324/181 |
| 4,025,848 | 5/1977 | Delagrange | 324/83 D |

Primary Examiner—Michael J. Tokar
Attorney, Agent, or Firm—David A. Boone

[57] ABSTRACT

Both positive and negative time interval measurements between start and stop channel signals are made without ambiguity during repetitive measurements. Circuitry monitors the start and stop channel signals and automatically changes the arming of the measurement circuitry whenever drifting of the signals requires a change in arming. Once the start or stop channel event is chosen as the initial source of the arming signal, subsequent arming signal selections are accomplished automatically.

2 Claims, 7 Drawing Figures

AUTOMATIC CONTROL OF ARMING SIGNAL FOR TIME INTERVAL MEASUREMENTS

BACKGROUND AND SUMMARY OF THE INVENTION

Time interval measurements between the occurrence of two signals must frequently be made. Many time interval measurement circuits have the ability to measure both positive and negative time intervals between the two signals, i.e., one of the signals is preselected as indicating a reference point in time, and if the other signal occurs before or after that signal, a negative or positive time interval would be measured.

The ability to measure both positive and negative time intervals presents an ambiguity problem when the time intervals occur repetitively. This is illustrated with respect to FIG. 1. In this example, both start and stop channel signals are pulse trains. Two time intervals, one positive and one negative, are able to be measured depending upon whether the start or stop channel is used to "arm" the measurement circuitry. Arm in this sense is used to indicate that the circuitry will measure the time interval between the next occurrence of start and stop channel events following the arming of the time interval circuitry.

Typically, the arming signal is derived from either the start or stop channel event. If the arming occurs at point 101, the time interval measured will be from point 121 to point 122. Note that the time interval which will be measured is a positive time interval, since the start event has occurred before the stop event. If the arming of the measurement circuitry occurs at point 102, the corresponding time interval measured will be from point 122 to point 123. Note that this is a negative time interval, since the stop event has occurred before the start event. Therefore, if armed randomly, the measurement circuitry will switch between measuring the interval between points 121 and 122 and the time interval between 122 and 123. Assume that both signals are pulse trains 100 nanoseconds in repetition interval and the time interval between point 121 and 122 is 30 nanoseconds, and the time interval between point 122 and point 123 is 70 nanoseconds. In that case, the display would flicker between showing a positive 30 nanosecond measurement and showing a negative 70 nanosecond measurement. Note that this problem is further complicated if the start and stop channel signals are drifting with respect to each other on repetitive measurements. In that case, even if the arming signal was consistently provided at point 101, there would still be an alternation between the positive and negative measurements because the signals 121 and 122 would not consistently be occurring in the same order. In accordance with the preferred embodiment of the present invention, one of the two input signals is chosen as the initial source of the arming signal. Thereafter, control circuitry comprising a phase detector controls the subsequent arming of the measurement circuitry after the initial selection has been made.

DESCRIPTION OF THE PREFERRED EMBODIMENT

In order to solve the flicker problem in the display, an adequate signal source to arm the time interval measurement circuitry is required. One choice for this source is to route one of the input signals into the arming circuitry. Two choices are available, one for the positive and one for the negative time interval measurements.

Figure 1:
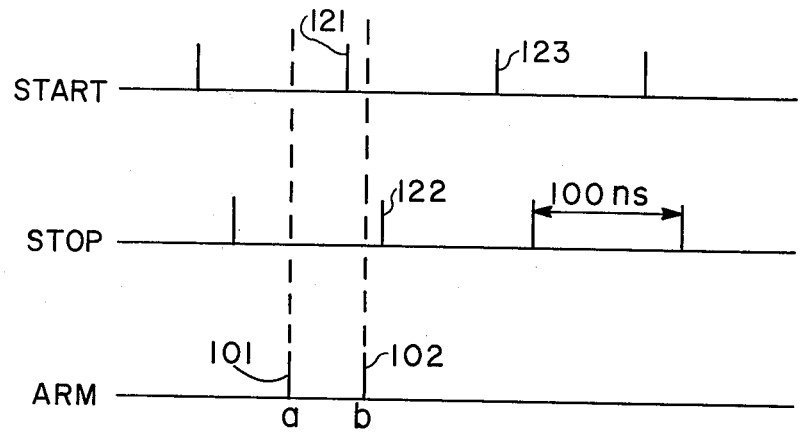
FIG. 1 illustrates two waveforms and the ambiguity which occurs when making time interval measurements therebetween.
Figure 2:
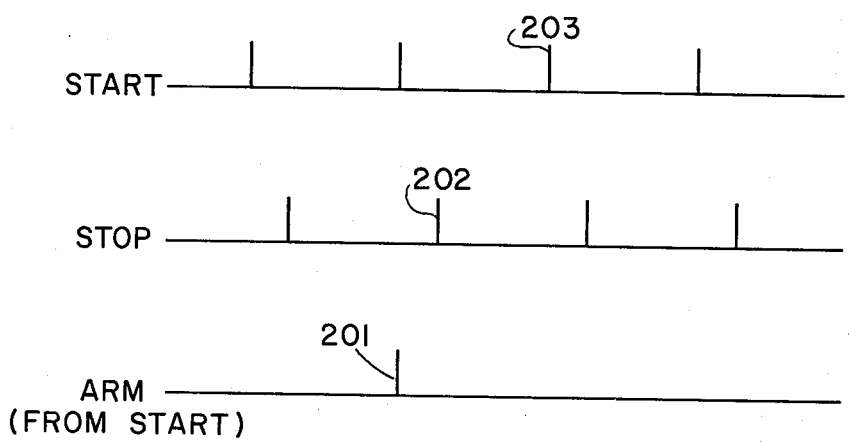
FIG. 2 illustrates the signal waveforms of the start channel, the stop channel, and the arm signal waveforms when the start channel is used to generate the arm signal.
Figure 3:
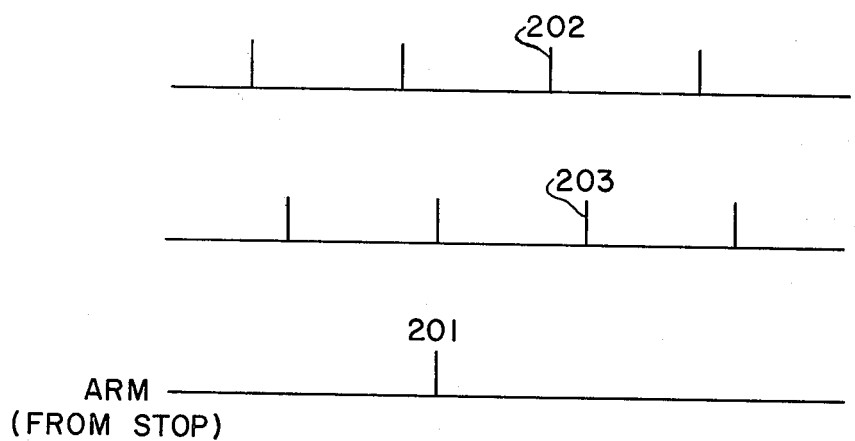
FIG. 3 illustrates the signal waveforms as in FIG. 2 except that the stop channel signal is used to generate the arming signal.

FIGS. 2 and 3 show examples of each input channel used to provide the arming signal. In FIG. 2, the start channel is used to generate the arming signal. If the arming occurs at point 201, then the time interval from point 202 to point 203 will be measured. This time interval will be negative because the stop signal occurred before the start signal. In FIG. 3, the stop channel signal is used to provide the arm source, and the time interval is positive from point 202 to point 203. Once the polarity of the time interval is chosen, the arm source can be selected to give a flicker-free answer, assuming that there is no drift of the start channel signal with respect to the stop channel signal.

However, many times the signals of interest are drifting with respect to each other. In the operation of time interval measurement circuitry, it is advantageous if the signals could be allowed to drift back and forth with respect to each other and still track the time interval flicker free. This type of measurement reading is particularly useful when one is attempting to make an adjustment to tune one signal with respect to the other. In this case, it is useful to be able to make the transition from a positive time interval through zero time interval to a negative time interval and back again without the flicker problem resulting from the arming signal being incorrect as the signals drift with respect to each other.

This convenience is provided in the preferred embodiment through the use of a phase detector. The initial arming is selected by the user. Thereafter, control circuitry monitors the phase of the two signals. As the two start and stop channel signals which are in repetitive mode, actually pulse trains, drift in either direction, the phase detector circuitry recognizes this and chooses the correct arming source. The result is a consistent time interval reading from $-T$ to $+T$ (T is the repetition period) going smoothly through zero.

When the time interval is zero, the two pulse trains are in phase and it does not matter which channel is selected as the arming source, because the start and stop events are simultaneous. The phase detector circuitry itself is unable to determine exactly which event came first. In this case, it does not matter which channel is used as the arming source, because the time interval is smaller than the time it takes for the arming signal to propagate through the circuitry. Assume for a moment that the stop channel signal is being used to provide the arming signal. As the stop channel signal drifts with respect to the start channel signal, the phase detector circuitry will cause a shift to using the start channel signal as the arming source.

Figure 6:
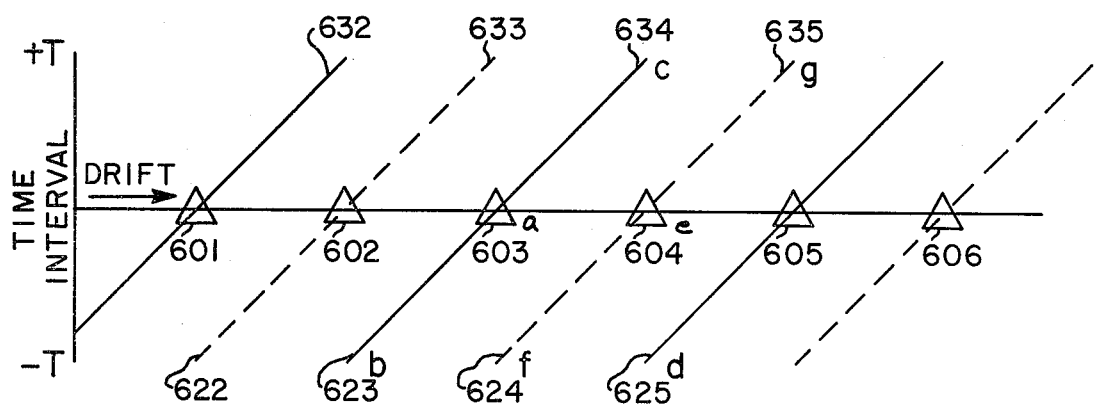
FIG. 6 is a graph depicting time interval measured with respect to signal drift for the preferred embodiment.

This is more clearly shown with respect to the graph shown in FIG. 6. FIG. 6 shows a graph of the time interval measured versus the drift of one channel with respect to the other. The phase detector circuit is in operation and a change of state occurs at points 601 through 606. Assume that the initial measurement starting point is at point 603 (the dotted line indicates an alternate starting point based on a different initialization state of the phase detector). The time interval measured will be zero, meaning that both the start and stop events occur at the same time. In this case, it does not matter which channel is used at the arming source because the time interval is smaller than the time it takes for the arming signal to propagate through the device. An example of this can easily be visualized with reference to FIG. 2. If events 201 and 202 are close enough together, the arming signal to be provided at point 201 will not have time to arm the machine until after after signal 202 has occurred. The time interval measured will thus be from point 203 to point 202, regardless of whether the arming signal is taken from the start channel or the stop channel.

As the stop channel then drifts with respect to the start channel to point 623, the phase detector shifts to use the start channel as the arming source, thus maintaining a negative time interval measurement. The actual magnitude of the time interval at point 623 can reach $-(T-10$ ns$)$ where T is the period of the incoming pulse train and 10 ns has been arbitrarily chosen as the time it takes for the arming signal to arm the device in the circuitry of the preferred embodiment.

As the direction of the drift is reversed, the time interval will move from point 623 to point 625. As the time interval again moves through point 603, the phase detector circuitry will again change state and select the stop channel as the arming source. At point 634, the time interval measured is $(T-10$ ns$)$.

As the time interval drifts from point 634 to point 625, it will go through point 604. Note that at point 604 the two signals are again in phase within the 10 ns arming period. Therefore, it will not matter which signal is used to provide the arming signal. If the drift of the signals continues, it will move on past point 625 to the next zero crossing of the two signals and beyond if the signals continue to drift.

If both inputs are of the same period, T, the measurement circuitry in accordance with the preferred embodiment should be able to measure from the stop to start event almost equal in time interval to $+$ or $-T$. Because of the necessity of the signal to propagate and arm the device, the range as stated above must actually be less by the propagation delay of the arming circuitry. In the preferred embodiment, this arming propagation delay is assumed to be 10 ns and therefore, a measurement range for the preferred embodiment would be between $-(T-10$ ns$)$ and $+(T-10$ ns$)$.

The time interval device assumed to be used in the preferred embodiment always measures the next event in each channel following the arm signal. Therefore, it is impossible to track the time interval measurement more than $+$ or $-T$ of drift. In cases where the drift is more than T, the device should latch onto the new phase relationship of the inputs and track these two as before.

Figure 4:
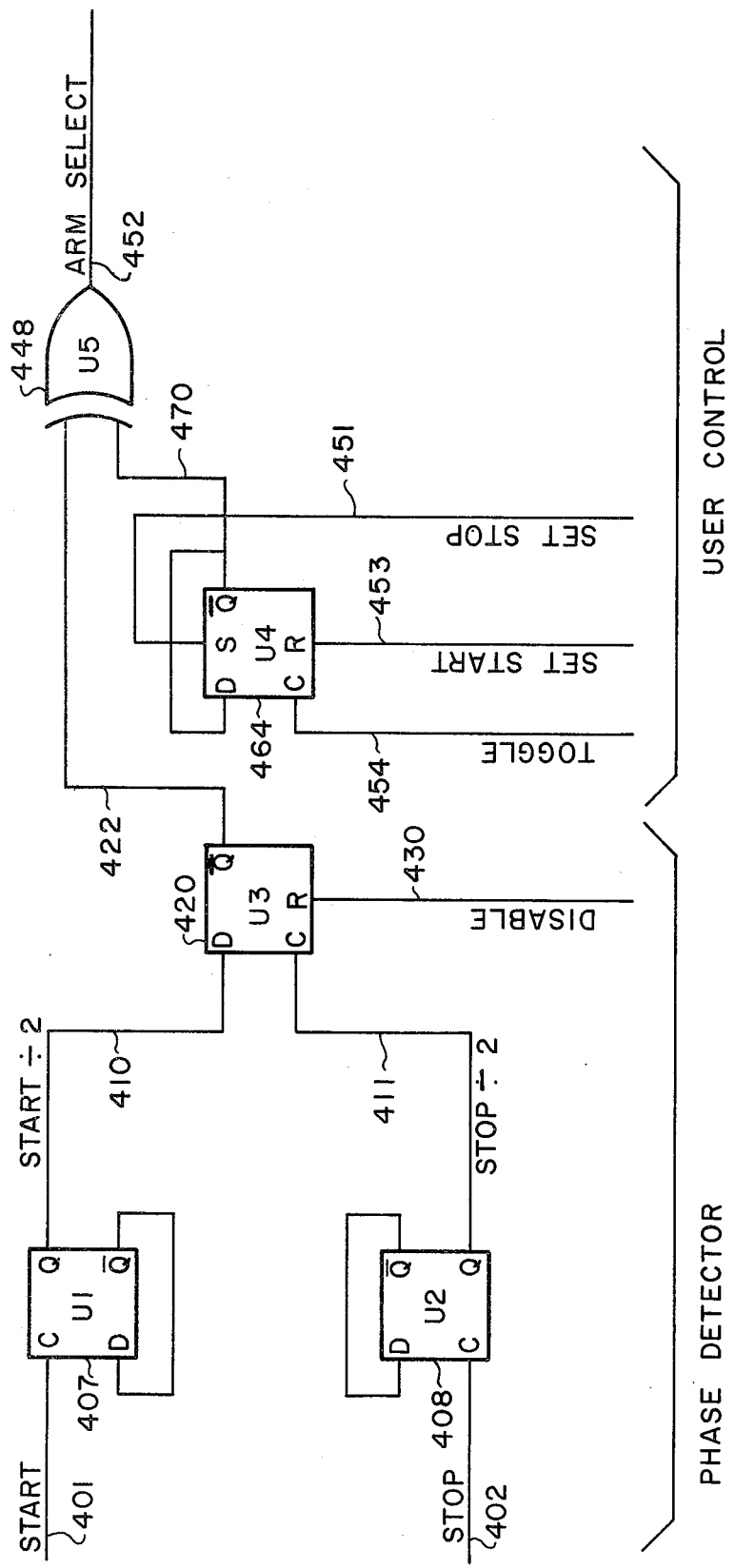
FIG. 4 is a circuit diagram of circuitry in accordance with one embodiment of the present invention.

Referring now to FIG. 4 there is shown control circuitry for use in the preferred embodiment. Note that the start channel signal is received on a line 401 while the stop channel signal is received on a line 402. The start channel signal is input to flip-flop 407 which toggles upon the receipt of each start channel event and provides the Q output on line 410 to the D input of flip-flop 420. The stop signal received on line 402 is input to flip-flop 408 which also toggles upon the receipt of each stop signal event and provides a Q output on line 411 to the clock input of flip-flop 420. Flip-flop 420 may be disabled by the signal provided on line 430.

Figure 5:
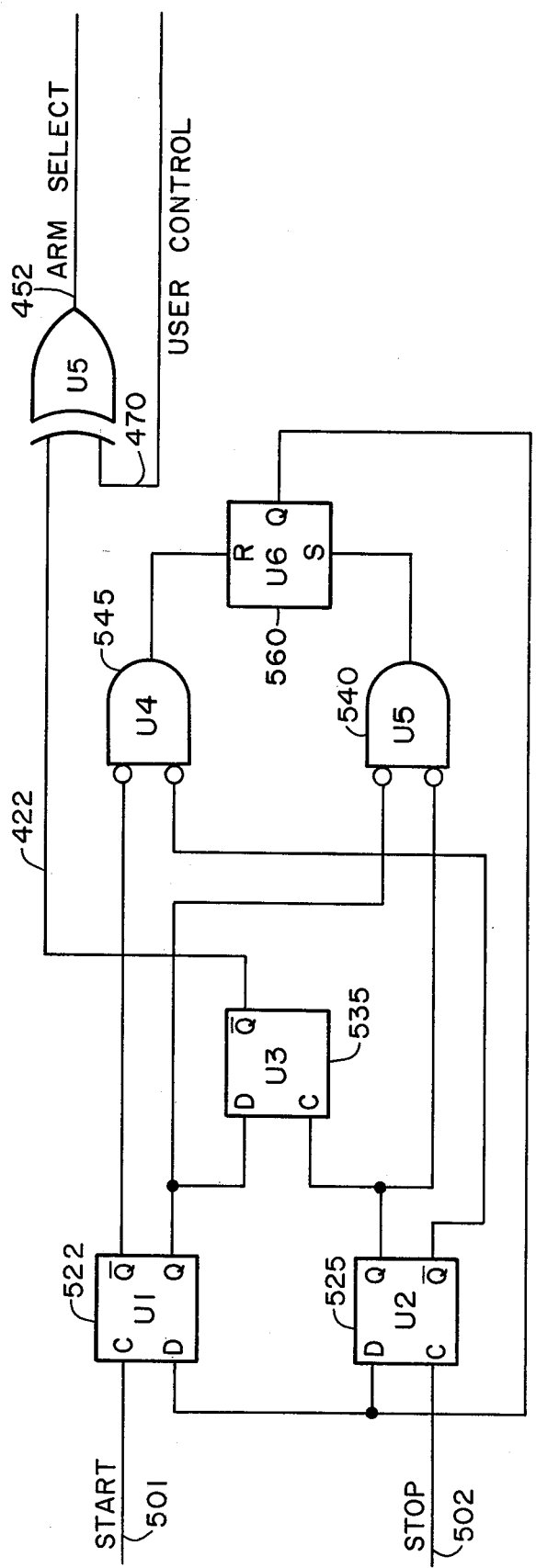
FIG. 5 is a circuit diagram of arming signal circuitry in accordance with an alternate embodiment of the present invention.

When flip-flop 420 is not disabled, it will provide on line 422 a signal which changes logic states each time there is a phase change between the signals on lines 401 and 402. The phase detector circuitry thus provides the automatic control of the arming select. User control is provided through flip-flop 464. The user selects the start channel as the initial arming signal by providing the signal on line 453 or initially selects the stop channel signal to provide the initial arming signal by providing the signal on line 451. In each case, a pulse is also sent on line 430 to reset the phase detector. If it is desirable to reverse the arming currently being used by the measurement circuitry, the signal on line 454 is provided and the arming originally selected will be reversed. Flip-flop 464 provides its output on line 470 to exclusive OR gate 448. The arming select signal thus provided on line 452 will be initially determined by the setting by the user of the initial arming signal. Thereafter, as phase changes occur and the signal on line 422 changes logic states, the arm select circuitry on line 452 will also change logic states, thus reversing the signal selected to arm the logic circuitry. An alternate control circuit is shown in FIG. 5. In this case, the start channel circuitry is received on line 501 and input to flip-flop 522. The stop channel circuitry is received on line 502 and input to flip-flop 525. The Q outputs of flip-flops 522 and 525 are then coupled to the D and clock inputs respectively of flip-flop 535. The reversal signal to reverse the arming is then provided by the $\overline{Q}$ output of flip-flop 535 on line 422. The circuit of FIG. 5 requires a user control like that in FIG. 4. This is supplied on line 470.

Figure 7:
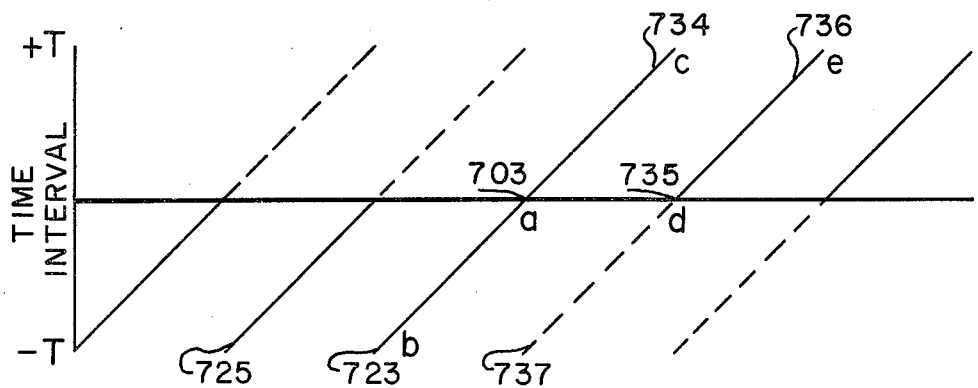
FIG. 7 is a graph depicting time interval measured with respect to signal drift for the alternate embodiment.

In this implementation, a continuing drift of the two signals with respect to each other which is greater than one time period, T, will not result in a crossover from a + time interval measurement through zero and then to a − time interval. Instead, the phase detector circuitry makes no change and the original channel selected remains as the arming source as the drift continues. The time interval continues as a positive measurement until it has drifted in a reverse direction. The time interval then takes up a new starting position along the new line it is on. For example, assume an initial starting position at 703. If the signals drift with respect to each other past 734, a new starting position at 735 is taken. If the signals continue to drift in the same direction, the time interval will approach 736. If they reverse direction, the dotted line will be taken toward 737. This phase detector is self-resetting. A disadvantage of the circuit shown in FIG. 5 is that additional propagation delay presented by the increased number of circuit components used would therefore limit the operation of this circuit to a lower frequency than that possible using the circuit shown in FIG. 4. The time interval graph of this circuit is shown in FIG. 7.

I claim:

1. A method for use in the measurement of time intervals between first and second signals, said method comprising:

selecting one of said first and second signals for use in providing an arming signal for said time interval measurement;

detecting preselected changes of said first signal with respect to said second signal; and selecting the other of said first and second signals for use in providing said arming signal for said time interval measurement in response to the detection of said preselected changes.

2. The method as in claim 1 wherein the step of detecting preselected changes comprises the step of detecting phase changes of said first signal with respect to said second signal.

* * * * *